United States Patent
Chifu et al.

(10) Patent No.: US 9,329,465 B2
(45) Date of Patent: May 3, 2016

(54) LIGHT SOURCE DEVICE AND PROJECTION-TYPE DISPLAY DEVICE INCLUDING FIRST AND SECOND LIGHT EMITTING ELEMENTS AND AIR FLOW DEVICE

(75) Inventors: Hiroko Chifu, Tokyo (JP); Motoyasu Utsunomiya, Tokyo (JP)

(73) Assignee: NEC Display Solutions, Ltd., Tokyo (JP)

( * ) Notice: Subject to any disclaimer, the term of this patent is extended or adjusted under 35 U.S.C. 154(b) by 88 days.

(21) Appl. No.: 14/345,628

(22) PCT Filed: Sep. 20, 2011

(86) PCT No.: PCT/JP2011/071357
§ 371 (c)(1),
(2), (4) Date: Mar. 18, 2014

(87) PCT Pub. No.: WO2013/042193
PCT Pub. Date: Mar. 28, 2013

(65) Prior Publication Data
US 2014/0340653 A1 Nov. 20, 2014

(51) Int. Cl.
*G03B 21/16* (2006.01)
*H04N 9/31* (2006.01)
(Continued)

(52) U.S. Cl.
CPC ............... *G03B 21/16* (2013.01); *F21V 29/02* (2013.01); *G03B 21/2033* (2013.01); *H04N 9/3144* (2013.01); *F21V 29/677* (2015.01);
(Continued)

(58) Field of Classification Search
CPC .... G03B 21/16; G03B 21/2033; F21V 29/02; H04N 9/3144
USPC ................... 353/57, 58, 60, 61; 362/294, 373
See application file for complete search history.

(56) References Cited

U.S. PATENT DOCUMENTS 7,942,548 B2 * 5/2011 Kawachi ............ H05B 33/0803
                                                         362/244
8,164,237 B2 * 4/2012 Wen ....................... F21V 29/83
                                                         313/46

(Continued)

FOREIGN PATENT DOCUMENTS

CN          1347004 A      5/2002
CN       101907819 A    12/2010

(Continued)

OTHER PUBLICATIONS

International Search Report (ISR) (PCT Form PCT/ISA/210), in PCT/JP2011/071357, dated Dec. 27, 2011.

(Continued)

*Primary Examiner* — Bao-Luan Le
(74) *Attorney, Agent, or Firm* — McGinn IP Law Group, PLLC

(57) ABSTRACT

The purpose of the present invention is to provide a device that is small in size and low noise, in which heat from a light emitting element such as an LD or an LED is efficiently dissipated. A light source device includes a first light emitting element, a base plate, and an air flow device for sending out air. The base plate, which is thermally connected to the first light emitting element, has a flat surface formed around the first light emitting element to face the emitting direction of light output from the first light emitting element. The air flow device generates a flow of air toward the flat surface of the base plate in a direction perpendicular to the flat surface.

18 Claims, 9 Drawing Sheets

(51) Int. Cl.
*F21V 29/02* (2006.01)
*G03B 21/20* (2006.01)
*F21W 131/406* (2006.01)
*F21Y 101/02* (2006.01)
*H01S 5/022* (2006.01)
*H01S 5/024* (2006.01)
*G03B 33/12* (2006.01)
*G02B 27/14* (2006.01)
*F21V 29/67* (2015.01)

(52) U.S. Cl.
CPC ....... *F21W2131/406* (2013.01); *F21Y 2101/02* (2013.01); *F21Y 2101/025* (2013.01); *G02B 27/141* (2013.01); *G03B 33/12* (2013.01); *H01S 5/02212* (2013.01); *H01S 5/02407* (2013.01)

(56) References Cited

U.S. PATENT DOCUMENTS

| | | | | |
|---|---|---|---|---|
| 8,226,273 | B2* | 7/2012 | Lai | F21V 29/83 362/249.02 |
| 8,562,143 | B2* | 10/2013 | Miyazaki | G03B 21/14 353/119 |
| 2005/0024834 | A1* | 2/2005 | Newby | F21K 9/00 361/719 |
| 2009/0160344 | A1 | 6/2009 | Hsu et al. | |
| 2010/0118280 | A1* | 5/2010 | Chen | G03B 21/16 353/61 |
| 2010/0129107 | A1 | 5/2010 | Takehara et al. | |
| 2010/0149494 | A1* | 6/2010 | Kawachi | H05B 33/0803 353/57 |
| 2011/0110095 | A1* | 5/2011 | Li | F21V 29/004 362/294 |
| 2013/0300946 | A1* | 11/2013 | Manabe | H04N 5/66 348/739 |

FOREIGN PATENT DOCUMENTS

| | | |
|---|---|---|
| JP | 2000-194067 A | 7/2000 |
| JP | 2006-147744 A | 6/2006 |
| JP | 2007-500448 A | 1/2007 |
| JP | 2008-262064 A | 10/2008 |
| JP | 2009-152192 A1 | 7/2009 |
| JP | 2010-128081 A | 6/2010 |
| JP | 2010-197497 A | 9/2010 |
| JP | 2011-170363 A | 9/2011 |
| WO | WO 2007/083552 A1 | 7/2007 |

OTHER PUBLICATIONS

Chinese Office Action dated Jan. 5, 2016 with an English translation thereof.

* cited by examiner

LIGHT SOURCE DEVICE AND PROJECTION-TYPE DISPLAY DEVICE INCLUDING FIRST AND SECOND LIGHT EMITTING ELEMENTS AND AIR FLOW DEVICE

TECHNICAL FIELD

The present invention relates to a light source device including an air flow device for sending out cooling air, and a projection-type display device.

BACKGROUND ART

As the projection-type display device, there is a projector for magnifying and displaying an image or a video. The projector is widely used for a personal theater, business presentation, and the like. The projection-type display device includes a light source, an optical engine having an optical system that acts on light emitted from the light source, and a heat dissipation mechanism for dissipating heat from the light source.

For the light source of the projection-type display device, an ultrahigh pressure mercury lamp is frequently used. However, the ultrahigh pressure mercury lamp has problems that include a short life and environmental pollution that is caused by mercury. An optical system is necessary for separating white light into lights of three primary colors, and etendue is large. Consequently, it is difficult to design a compact device.

Recently, development has been pursued on a projection-type display device which uses, as a light source device, a light emitting element such as a laser diode (LD) or a light emitting diode (LED). Such a light emitting element has the advantages of consuming a low amount of power and long life. The light emitting element emits light and generates heat. In such a light emitting element, a part of electric current applied to generate light is converted into Joule heat, and accordingly the light emitting element itself generates heat. For example, in the case of a light emitting element where light-power conversion efficiency (Wall-Plug Efficiency: WPE) is 30%, 30% of applied power is used for light generation, and the remaining 70% is converted into heat in the light emitting element.

The characteristics of the light emitting element depend on temperature. The increase of the temperature of the light emitting element affects the wavelength of light, the optical output, or the element life. In Particular, in the case of the LD, an oscillation wavelength usually shifts to a long wavelength side when the temperature increases, or the efficiency of converting electric current into a light output, namely, slope efficiency, declines. This necessitates stable dissipation of heat from the light emitting element and members in the vicinity during the operation of the light emitting element.

JP 2006-147744 A discloses a light source device which includes a light emitting element such as an LD or an LED, a substrate for supporting the light emitting element, and a plurality of heat dissipation fins of a heat sink. The fins extend toward the rear surface of the light emitting element. The light source device further includes a fan for blowing air to the plurality of heat dissipation fins. Heat generated in the light emitting element is dissipated by air that blows from the fan to the plurality of dissipation fins.

In the case of a compact and thin light source device, the area of a region where heat dissipation fins are formed is limited, and thus it is difficult to secure sufficient heat dissipation performance. When the area of the region where the heat dissipation fins are formed is increased to secure sufficient heat dissipation performance, the light source device is enlarged.

In the light emitting element such as an LD or an LED, an electric terminal for supplying power to the light emitting element extends in a direction opposite the emitting direction of light. This electric terminal is generally connected to a circuit formed on a wiring board, and is electrically connected to a driver via the wiring board. The arrangement of the wiring board behind the light emitting element may limit the area where the heat dissipation fins are formed. In particular, in the case of the high-output LD, large electric current must be applied, and thick wires must be laid, thus increasing the size of the wiring board. Thus, the installation area of the heat dissipation fins is smaller, and it may even be difficult to install heat dissipation fins. As a result, the heat dissipation effect of the light emitting element declines. If the amount of air that is blown by the fan is increased to compensate for the shortage of heat dissipation performance, noise will increase.

JP 2010-197497 A discloses a projector which includes a laser emitting device as an excitation light source for applying excitation light, a phosphor irradiated with the excitation light to emit light, and a cooling fan. The cooling fan is disposed on the downstream side of the laser emitting direction of the laser emitting device. An exhaust noise reduction device is disposed on a side opposite the cooling fan sandwiching the laser emitting device. Accordingly, air that is sent out from the cooling fan may advance linearly alongside the laser emitting device to reach the exhaust noise reduction device.

Thus, in a cooling method where the cooling air is caused to advance linearly alongside a heat generator such as a light emitting device, an increase in the wind velocity of the cooling air is accompanied by an increase in cooling efficiency. However, when a large cooling fan is used to sufficiently increase the wind velocity of air, this causes an increase in the size of the projector, and noise increases. When miniaturization of the cooling fan and reduction of noise are tried, sufficient wind velocity cannot be set, nor is the heat dissipation effect of the light emitting element adequate.

Thus, there is a demand for a light source device small in size and low in noise, and having a heat dissipation mechanism capable of effectively dissipating heat from a light emitting element such as an LD or an LED, and a projection-type display device including the same.

CITATION LIST

Patent Literature 1: JP 2006-147744 A
Patent Literature 2: JP 2010-197497 A

SUMMARY OF INVENTION

A light source device according to the present invention includes a first light emitting element, a base plate, and an air flow device for sending out air. The base plate, which is thermally connected to the first light emitting element, has a flat surface formed around the first light emitting element to face the emitting direction of light output from the first light emitting element. The air flow device generates a flow of air toward the flat surface of the base plate in a direction perpendicular to the flat surface.

According to the light source device thus configured, by generating a turbulent flow accompanied by generation/dissipation of an unsteady swirl near the light emitting element, the heat dissipation effect of the light emitting element can be improved without increasing the flow rate of the air flow device. As a result, the compact and low-noise light source device can be provided.

DESCRIPTION OF EMBODIMENTS

Next, the embodiments of the present invention will be described with reference to the drawings. Hereinafter, a projection-type display device that includes a light source device having a light emitting element will be described. However, the present invention can be applied to a general light source device which includes an air flow device for dissipating heat from a light emitting element such as an LD or an LED.

First Embodiment

Figure 1A:
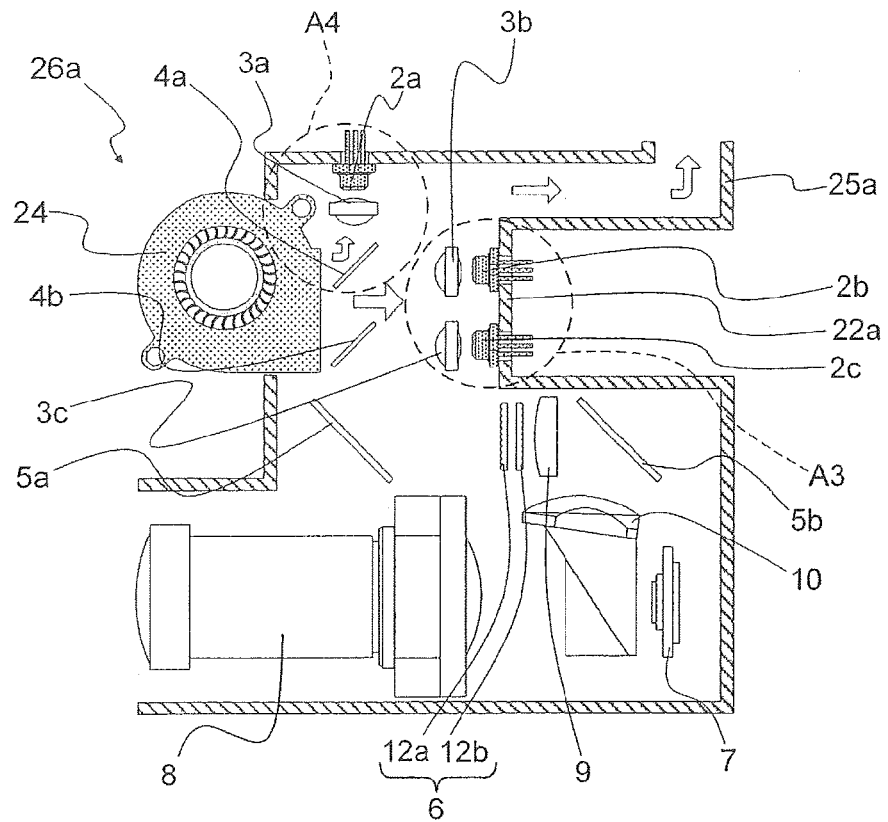
FIG. 1A is a schematic top view illustrating a light source device according to a first embodiment.

A projection-type display device includes a light source device which includes an optical engine and an air flow device for dispersing air. FIG. 1A is a schematic top view illustrating the light source device. For air flow device 24, a fan or a blower can be used. The optical engine includes light emitting elements 2a to 2c, an optical system that acts on lights emitted from light emitting elements 2a to 2c, and base plate 22a surrounding light emitting elements 2a to 2c and the optical system. Base plate 22a is thermally connected to light emitting elements 2a to 2c.

Figure 1B:
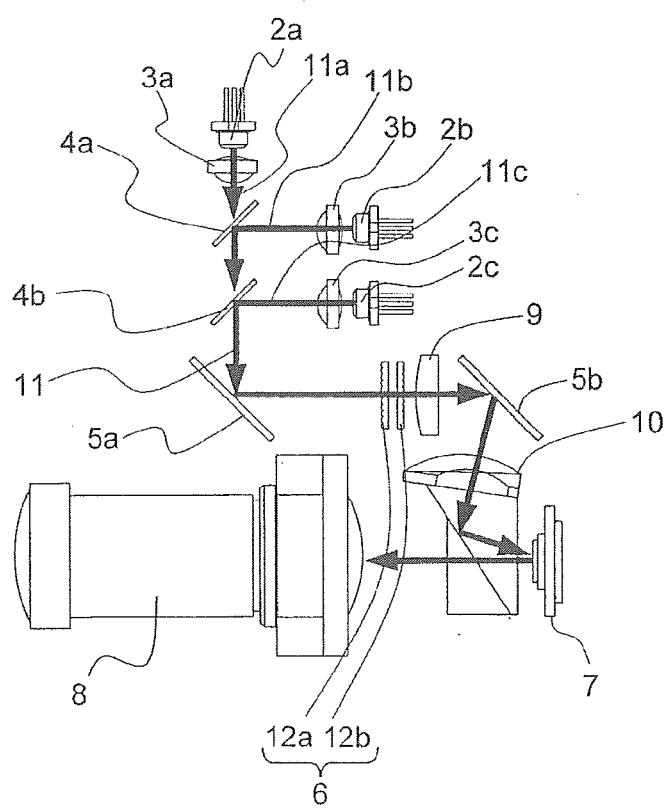
FIG. 1B is a schematic diagram illustrating the optical system an optical path of light in the light source device.

FIG. 1B illustrates the optical system of light source device 26a and the optical paths of the lights emitted light emitting elements 2a to 2c. In the embodiment, light source device 26a includes light emitting element 2a for emitting red light, light emitting element 2b for emitting green light, and light emitting element 2c for emitting blue light. For light emitting elements 2a to 2c, for example, an LD or an LED can be used. In Particular, high directivity enables an LD to have the advantage of high light utilization efficiency.

The optical system in the embodiment includes collimator lenses 3a to 3c, dichroic mirrors 4a and 4b, mirrors 5a and 5b, optical integrator 6, spatial light modulation element 7, projection lens 8, condenser lens 9, and Total Inner Reflection (TIR) prism 10. For spatial light modulation element 7, for example, DMD (Digital Mirror device) can be used. In the example shown in FIGS. 1A and 1B, optical integrator 6 is formed by a pair of fly-eye lenses 12a and 12b.

Next, the optical paths of lights 11a to 11c emitted from light emitting elements 2a to 2c will be described referring to FIG. 1B. Lights 11a to 11c emitted from light emitting elements 2a to 2c respectively pass through corresponding collimator lenses 3a to 3c to be made parallel lights. Then, red light 11a is transmitted through dichroic mirror 4a while green light 11b is reflected on dichroic mirror 4a. Accordingly, red light 11a and green light 11b are synthesized. The light obtained by synthesizing the red light and the green light is transmitted through dichroic mirror 4b while blue light 11c is reflected on dichroic mirror 4b. Accordingly, red light 11a, green light 11b, and blue light 11c are synthesized.

The light thus synthesized is reflected on mirror 5a to enter optical integrator 6. Synthesized light 11 is converted into a rectangular light flux having a uniform illuminance distribution by optical integrator 6. The rectangular light flux passes through condenser lens 9 to be reflected on mirror 5b. The light reflected on mirror 5b is applied through TIR prism 10 to spatial light modulation element 7. By spatial light modulation element 7, the rectangular light flux is subjected to light modulation according to an image signal. The light subjected to light modulation is transmitted through TIR prism 10 to enter projection lens 8, and magnified to be projected to a screen not shown by projection lens 8.

Figure 2A:
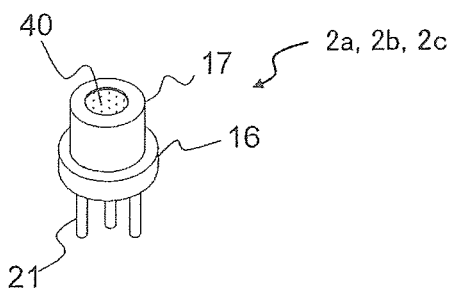
FIG. 2A is a schematic diagram illustrating the configuration of a laser diode which is a light emitting element.
Figure 2B:
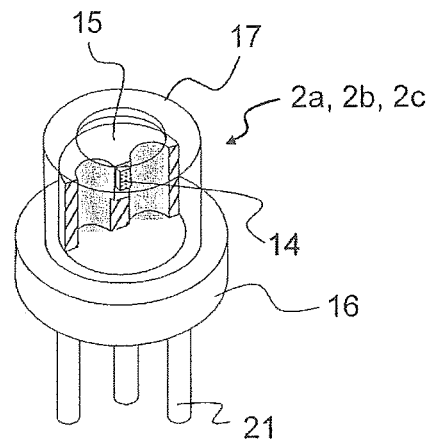
FIG. 2B is a partially broken perspective view illustrating the internal configuration of the laser diode.
Figure 2C:
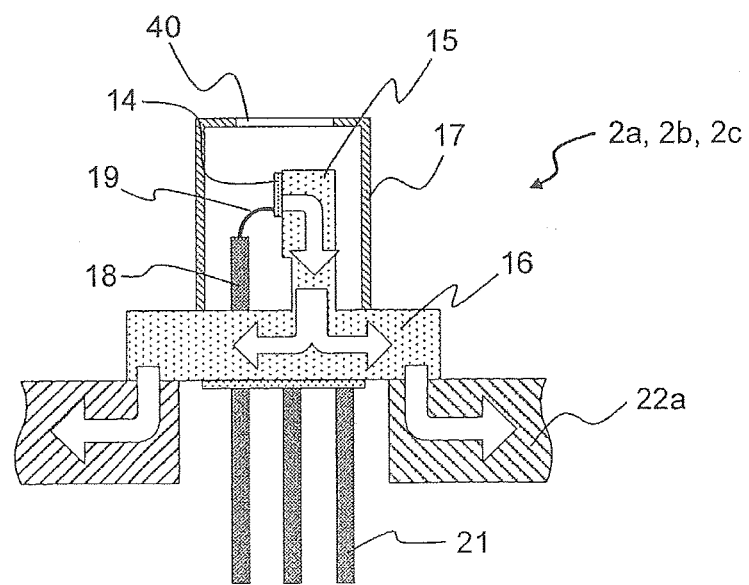
FIG. 2C is a schematic sectional view illustrating the heat dissipation path of the laser diode.

FIG. 2A is a schematic perspective view illustrating light emitting elements 2a to 2c. FIG. 2B illustrates the internal configuration of each of light emitting elements 2a to 2c. FIG. 2C illustrates the heat dissipation path of each of light emitting elements 2a to 2c. FIGS. 2A to 2C illustrate the laser diode of a CAN type as an example.

Light emitting elements 2a to 2c each includes laser diode chip 14, sub-mount 15 to which laser diode chip 14 is fixed, and pedestal (stem) 16 integrally formed with sub-mount 15.

Laser diode chip 14, sub-mount 15, and stem 16 are housed in a space including stem 16 and cap 17 having irradiation window 40.

Laser diode chip 14 is connected to electrode 18 via wire 19. Electrode 18 extends through stem 16 to the outside to constitute terminal 21. Terminal 21 extends to the outside of base plate 22a for housing the optical system of the optical engine. Terminal 21 is electrically connected to an external driver, not shown. When electric current is applied to electrode 18, laser diode chip 14 oscillates a laser beam by stimulated emission. The laser beam is output from irradiation window 40 to the outside of the light emitting element.

Energy that is not converted into any laser beam changes into Joule heat. Heat generated at laser diode chip 14 is conducted through sub-mount 15 to stem 16, and then conducted to base plate 22a that is thermally connected to stem 16. Base plate 22a functions as a heat dissipation plate of light emitting elements 2a to 2c. Preferably, base plate 22a is a metal with high heat conductivity.

Figure 3:
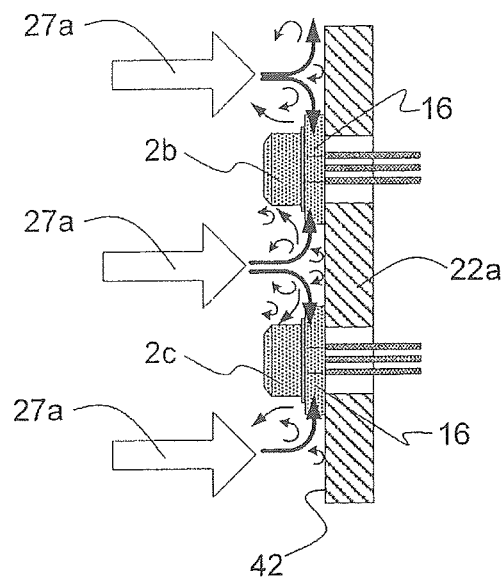
FIG. 3 is an enlarged view showing region A3 shown in FIG. 1.

FIG. 3 is an enlarged view of region A3 shown in FIG. 1A and illustrates the flow of air from air flow device 24. In light source device 26a of the embodiment, air flow device 24 is disposed on a side opposite light emitting elements 2b and 2c sandwiching the optical engine (see FIGS. 1A and 1B). Base plate 22a has flat surface 42 formed around light emitting elements 2b and 2c to face the emitting direction of the lights output from light emitting elements 2b and 2c.

Air 27a that is sent out from air flow device 24 passes through the optical system in the optical engine to light emitting elements 2b and 2c. Air 27a flows in a direction perpendicular to flat surface 42 of base plate 22a that is thermally connected to stem 16 of light emitting elements 2b and 2c. Accordingly, air flow device 24 generates a flow of air 27a toward flat surface 42 in a direction perpendicular to flat surface 42.

To improve the heat dissipation effect of a heat generating flat plate by forced air cooling, there are two approaches, namely, a thin-film method and a substitution method. The thin-film method is a method for enhancing heat exchange from the heat generating flat plate to cooling air by thinning a temperature boundary layer that is constituted from relatively high-temperature air and that is formed near the surface of the heat generating flat plate. The thickness of the temperature boundary layer is inverse-proportional to the square root of the wind velocity along the heat generating flat plate. Thus, by increasing the wind velocity along the heat generating flat plate, the thickness of the temperature boundary layer is reduced, and thus the heat dissipation effect of the heat generating flat plate is improved.

The substitution method is a method for facilitating substitution of hot air near the heat generating flat plate with cold air present at a position slightly away from the heat generating flat plate (temperature substitution). This is achieved by the approach of generating a turbulent flow accompanied by generation/dissipation of an unsteady vortex near the heat generating flat plate. Thus, the relatively high-temperature air can be prevented from remaining near the heat generating flat plate to enhance heat exchange from the heat generating flat plate to the cooling air.

According to the embodiment, when the air impinges on flat surface 42 of base plate 22a around light emitting elements 2b and 2c from the perpendicular direction, the swirling vortex of a turbulent flow is generated near light emitting elements 2b and 2c (refer to FIG. 3). Through the process of destruction (peeling) of the temperature boundary layer near flat surface 42 caused by the swirling vortex, fluid substitution (temperature substitution) caused by the swirling vortex, and wall surface sliding of air caused by the Coanda effect, light emitting elements 2b and 2c and surrounding base plate 22a are cooled. The Coanda effect means that when a solid is placed in the fluid, the pressure of the fluid near the wall surface of the solid reduces to attract the flow of the fluid to the wall surface and, as a result, the flow of the fluid changes in a direction along the wall surface of the solid. In light source device 26a of the embodiment, light emitting elements 2b and 2c and surrounding base plate 22a are cooled through such a process. Thus, the cooling effect can be increased 5 to 10 times more than that in the case of the cooling method of supplying air along the surface of base plate 22a.

Preferably, the blowing port of air flow device 24 is disposed in base plate 22 serving as the exterior of the optical engine. Accordingly, air flow device 24 can directly send out cooling air into the optical engine. Preferably, air flow device 24 is disposed on the downstream side of the emitting direction of the lights from light emitting elements 2b and 2c. Accordingly, the air that is flowed from air flow device 24 flows linearly to light emitting elements 2b and 2c. According to the embodiment, by arranging mirrors, namely, dichroic mirrors 4a and 4n in this case, between air flow device 24 and light emitting elements 2b and 2c, such an arrangement of air flow device 24 is enabled. Such an arrangement of air flow device 24 enables achievement of compact and thin light source device 26a.

Preferably, optical components installed in the optical engine and a holder for holding the optical components are arranged to function as ventilation ducts for effectively guiding the air from air flow device 24 to light emitting elements 2b and 2c. In the embodiment, such optical components are collimator lenses 3b and 3c and dichroic mirrors 4a and 4b. Accordingly, ventilation resistance (system impedance) is reduced, enabling a sufficient flow rate, in other words, a sufficient impingement jet flow velocity, to be maintained. Thus, the high cooing performance in a compact cooling system can be constructed. As a result, a compact light source device can be provided at low cost.

As described above, in the case of the laser diode of the CAN type, terminal 21 extending from stem 16 is electrically connected to the driver via the wiring pattern. The wiring pattern interferes with attaching a large heat dissipation fin to terminal 21 side or reducing heat resistance from the heat generating part to the heat dissipation fin. The present invention is particularly useful for cooling the laser diode of the CAN type because such a problem does not occur.

As shown in FIG. 1, a part of heat conductive base plate 22a preferably constitutes exhaust duct 25a. Alternatively, an exhaust duct can be constituted by a member thermally connected to base plate 22a and formed separately from base plate 22a. Accordingly, even during the period from the impingement of the cooling air with light emitting elements 2b and 2c or nearby base plate 22a to the discharging toward duct 25a, heat can be released from the wall surface of duct 25a to the cooling air. Thus, the heat dissipation effect can be further improved.

Figure 4:
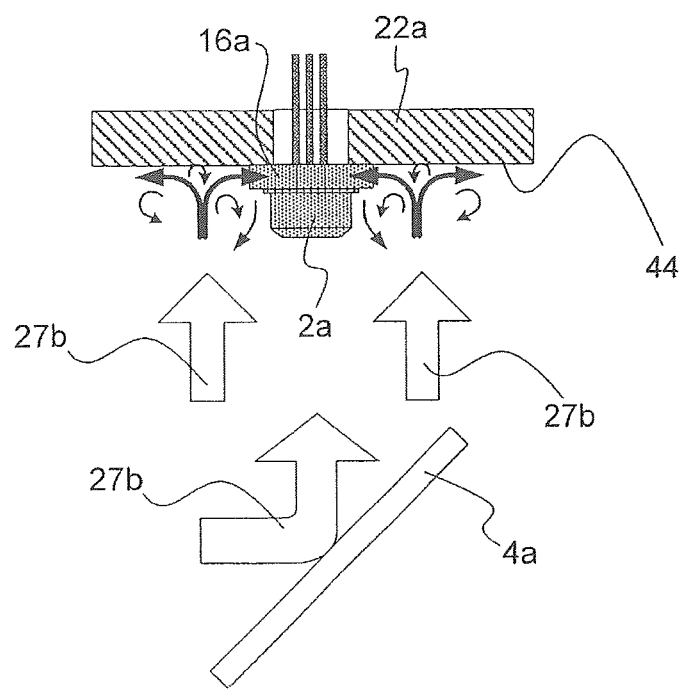
FIG. 4 is an enlarged view showing region A4 shown in FIG. 1.

FIG. 4 is an enlarged view of region A4 shown in FIG. 1A. In the embodiment, one 2a of the plurality of light emitting elements is disposed in region A4. Such an arrangement of light emitting elements 2a to 2c is advantageous that it reduces the number of optical components for synthesizing the lights emitted from the plurality of light emitting elements 2a to 2c. In particular, the optical axis of light emitting element 2a and the optical axes of light emitting elements 2b and 2c are preferably orthogonal to each other. In this case, emitting element 2a is not disposed on a straight line connecting air flow device 24 with emitting elements 2b and 2c.

When such a plurality of light emitting elements 2a to 2c is arranged, a wind direction plate is preferably disposed between light emitting elements 2a, 2b and air flow device 24. The wind direction plate preferably includes the optical component, namely, dichroic mirror 4a in this case that acts on the lights emitted from light emitting elements 2a and 2b (also refer to FIG. 1A). Specifically, the direction of a part of the advancing air sent out from air flow device 24 is bent toward light emitting element 2a by dichroic mirror 4a. In other words, light emitting element 2a is disposed on the downstream side of the bent direction of the advancing air. This is advantageous in that all light emitting elements 2a to 2c can be cooled by single air flow device 24 and it is not necessary to any additional air flow device. By using the optical component as the wind direction plate, the number of optical components of the optical engine can be reduced. Thus, costs can be reduced, and the light source device can be miniaturized.

Preferably, base plate 22a has flat surface 44 formed around light emitting element 2a to face the emitting direction of the light output from light emitting element 2a. Air 27b whose direction is bent by dichroic mirror 4a perpendicularly impinges on flat surface 44 of base plate 22a. Accordingly, a swirling vortex is generated near light emitting element 2a as described above, and the heat dissipation effect of light emitting element 2a can be improved.

In FIG. 1A, light emitting element 2a and light emitting elements 2b and 2c are thermally connected to base plate 22a made of the same member. However, these elements can be thermally connected to separately base plates.

Light source device 26a of the embodiment includes three light emitting elements 2a to 2c because it is applied to a projection-type display device which displays a full-color image. However, the present invention can be applied to a light source device which includes at least one light emitting element.

Second Embodiment

Figure 5A:
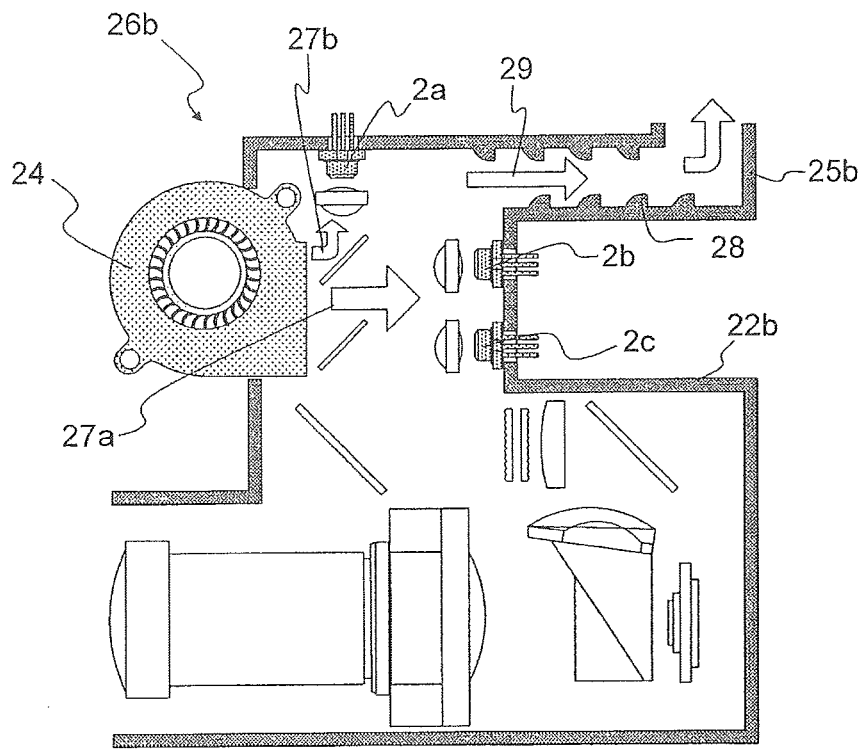
FIG. 5A is a schematic top view illustrating a light source device according to a second embodiment.
Figure 5B:
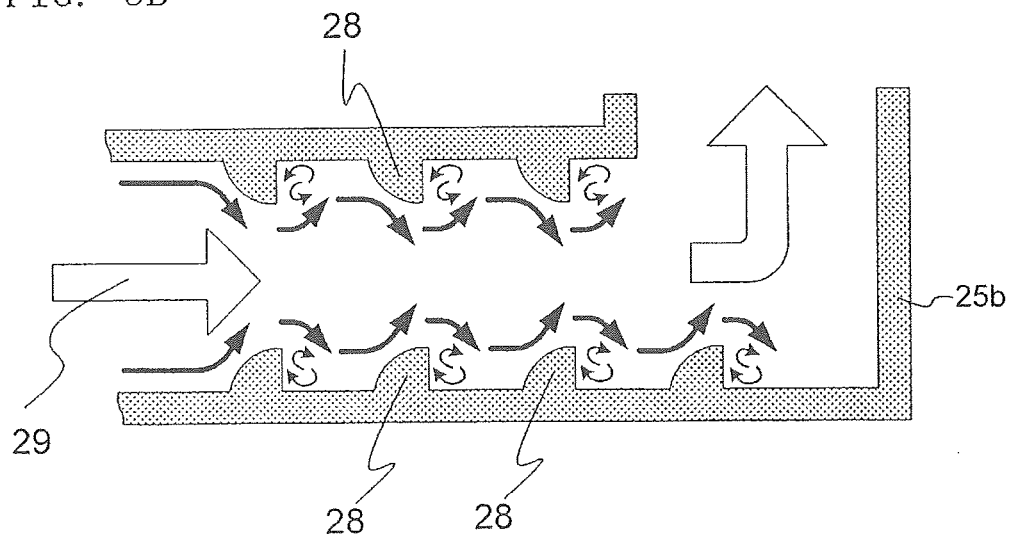
FIG. 5B is an enlarged view illustrating the configuration of the exhaust duct of the light source device shown in FIG. 5A.

Next, a light source device according to the second embodiment of the present invention will be described. FIG. 5A illustrates light source device 26b according to the second embodiment. FIG. 5B is an enlarged view illustrating the configuration of the exhaust duct of light source device 26b shown in FIG. 5A. Description of components similar to those of the first embodiment will be omitted.

In the embodiment, duct 25b for discharging air from an optical engine is formed integrally with base plate 22b thermally connected to light emitting elements 2a to 2c. Alternatively, duct 25b can be constituted by a member thermally connected to base plate 22b and formed separately from base plate 22b.

In light source device 26b of the embodiment, a plurality of micro-projections 28 is disposed in the inner wall of duct 25b. Micro-projection 28 operates as a turbulent flow accelerator (turbulence promoter) that accelerates generation of a turbulent flow. Specifically, during passage of exhaust air 29 from air flow device 24 through the inside of duct 25b, a swirling vortex of a turbulent flow is generated on the downstream side of micro-projections 28. In this case, ventilation resistance increases. However, the increase of a heat dissipation effect caused by the turbulent flow swirl is larger than the reduction of the heat dissipation effect accompanying the increase of the ventilation resistance. As a result, the heat dissipation performance of light source device 26b can be improved.

Such a turbulence promoter is preferably formed in the inner wall of duct 25b constituted by a part of base plate 22b thermally connected to light emitting elements 2a to 2c. It is because the heat dissipation performance can be improved with a compact and simple configuration.

Third Embodiment

Figure 6A:
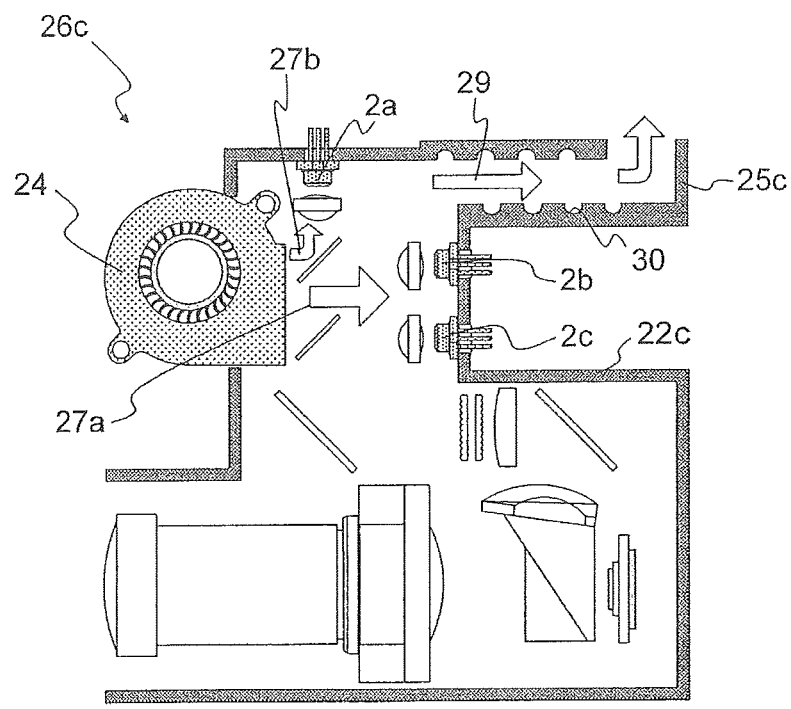
FIG. 6A is a schematic top view illustrating a light source device according to a third embodiment.
Figure 6B:
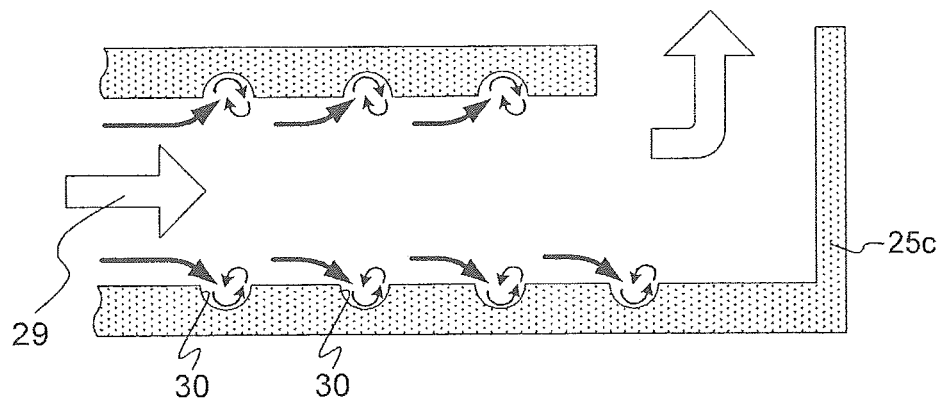
FIG. 6B is an enlarged view illustrating the configuration of the exhaust duct of the light source device shown in FIG. 6A.

Next, a light source device according to the third embodiment of the present invention will be described. FIG. 6A illustrates light source device 26c according to the third embodiment. FIG. 6B is an enlarged view illustrating the configuration of the exhaust duct of light source device 26c shown in FIG. 6A. Description of components similar to those of the first embodiment will be omitted.

In the embodiment, dust 25c for discharging air from an optical engine is formed integrally with base plate 22c thermally connected to light emitting elements 2a to 2c. Alternatively, duct 25c can be constituted by a member thermally connected to base plate 22c and formed separately from base plate 22c.

In light source device 26c of the embodiment, a plurality of micro-dents (dimples) 30 is disposed in the inner wall of duct 25c. Micro-dents 30 operate as the turbulence promoter. Specifically, during passage of exhaust air 29 from air flow device 24 through the inside of duct 25c, a swirling vortex of a turbulent flow is generated in an area where micro-dents 30 have been formed. Heat dissipation performance can be improved by the swirling vortex of a turbulent flow.

Such a turbulence promoter is preferably formed in the inner wall of duct 25c constituted by a part of base plate 22c thermally connected to light emitting elements 2a to 2c. This is because the heat dissipation performance can be improved with a compact and simple configuration.

In the second embodiment and the third embodiment, the turbulence promoters respectively include micro-projections 28 and micro-dents 30 formed in the inner wall of the ducts. However, as long as a turbulent flow is generated near the inner wall of the duct, the turbulence promoter can include members other than micro-projections 28 or micro-dents 30.

Fourth Embodiment

Figure 7:
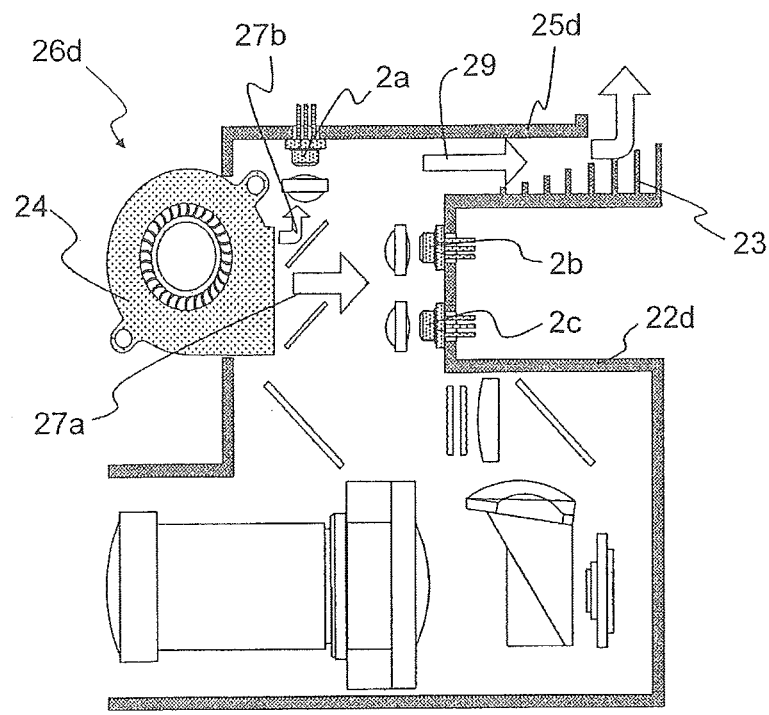
FIG. 7 is a schematic top view illustrating a light source device according to a fourth embodiment.

Next, a light source device according to the fourth embodiment of the present invention will be described. FIG. 7 illustrates light source device 26d according to the fourth embodiment. Description of components similar to those of the first embodiment will be omitted.

In the embodiment, heat dissipation fin 23 is disposed in the inner wall of exhaust duct 25d that is formed integrally with base plate 22d thermally connected to light emitting elements 2a to 2c. In this case, duct 25d has a heat sink function. Specifically, exhaust air 29 sent out from air flow device 24 to receive heat from light emitting elements 2a to 2c absorbs heat from duct 25d that is thermally connected to base plate 22d via heat dissipation fin 23. Thus, the heat dissipation capacity of light source device 26d increases, thereby enabling improvement of cooling performance.

Fifth Embodiment

Figure 8:
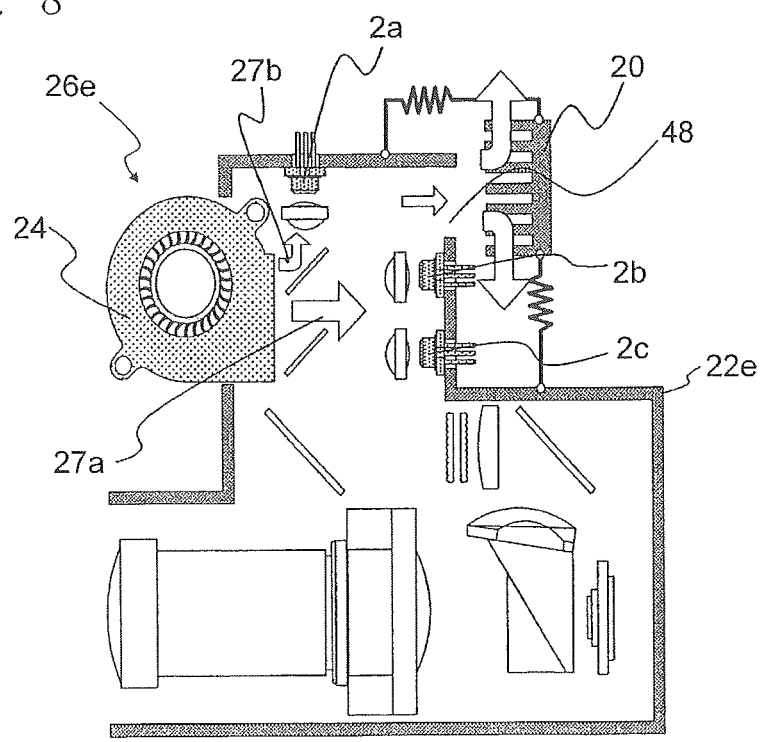
FIG. 8 is a schematic top view illustrating a light source device according to a fifth embodiment.

A light source device according to the fifth embodiment of the present invention will be described. FIG. 8 illustrates light source device 26e according to the fifth embodiment. Description of components similar to those of the first embodiment will be omitted.

In light source device 26e of the embodiment, a part of base plate 22e thermally connected to light emitting elements 2a to 2c includes exhaust port 48 for discharging air from an optical engine. Heat sink 20 thermally connected to base plate 22e is disposed outside exhaust port 48. In this case, sufficient heat dissipation performance can be secured even without directly forming any turbulence promoter or heat sink in the base plate. Thus, manufacturing of light source device 26e is facilitated, and design flexibility is improved.

Heat sink 20 of the embodiment can be installed outside the exhaust ports of ducts 25a to 25d of the first to fourth embodiment.

Sixth Embodiment

Figure 9A:
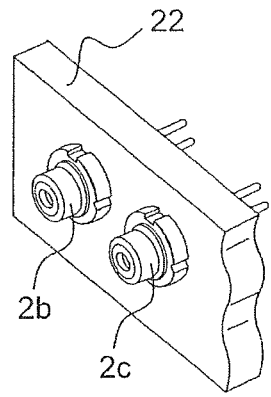
FIG. 9A is a schematic perspective view illustrating a light emitting element and a base plate.
Figure 9B:
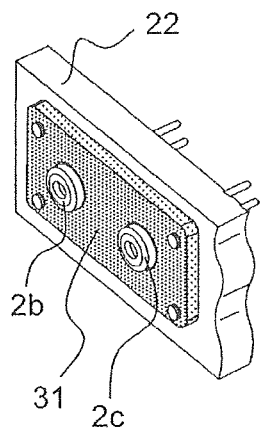
FIG. 9B is a schematic perspective view illustrating an example of a configuration for fixing the light emitting element to the base plate.
Figure 9C:
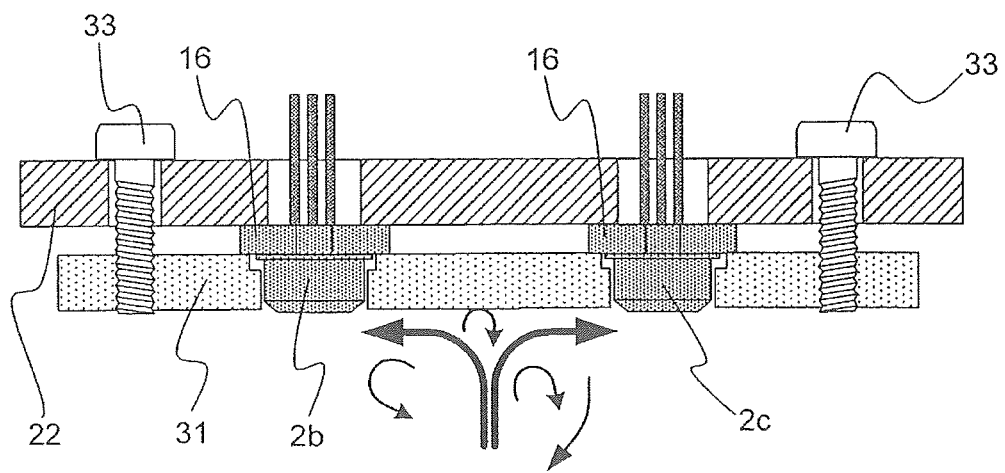
FIG. 9C is a schematic sectional view illustrating the configuration shown in FIG. 9B.

A light source device according to the sixth embodiment of the present invention will be described. Description of components similar to those of the first embodiment will be omitted. In the embodiment, a configuration for fixing a light emitting element to a base plate will be described. FIG. 9A is a schematic perspective view illustrating a light emitting element and a base plate. FIG. 9B illustrates an example of a configuration for fixing the light emitting element to the base plate. FIG. 9C is a schematic sectional view showing the configuration shown in FIG. 9B. The configuration of base plate 22 is similar to those shown in the first to fifth embodiments.

As shown in FIG. 9A, in the first embodiment, light emitting elements 2b and 2c are attached to base plate 22 that is thermally connected to stem 16. On the other hand, in the sixth embodiment, as illustrated in FIGS. 10B and 10C, light emitting elements 2b and 2c are supported on a support plate 31.

Specifically, support plate 31 is disposed on the flat surface side of base plate 22 to support light emitting elements 2b and 2c. When the LD of a CAN type is fixed to base plate 22, a through-hole through which cap 17 of the LD is passed is formed in support plate 31. The LD is fitted into the through-hole from the exit side of a laser beam.

Support plate 31 is fixed to base plate 22 by, for example, screw 33. Accordingly, stem 16 of light emitting elements 2b and 2c is pressed to base plate 22 to be thermally connected to base plate 22. When support plate 31 shown in FIGS. 9B and 9C is used, support plate 31 may serve as a barrier to prevent air from air flow device 24 from reaching base plate 22. Consequently, the cooling efficiency of light emitting elements 2b and 2c may reduce.

Figure 10A:
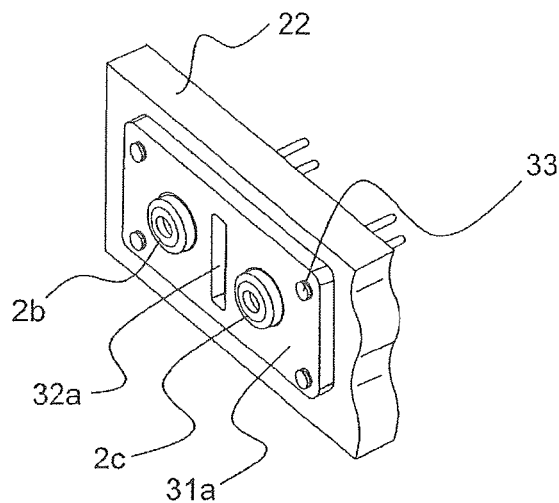
FIG. 10A is a schematic perspective view illustrating another configuration for fixing the light emitting element to the base plate.
Figure 10B:
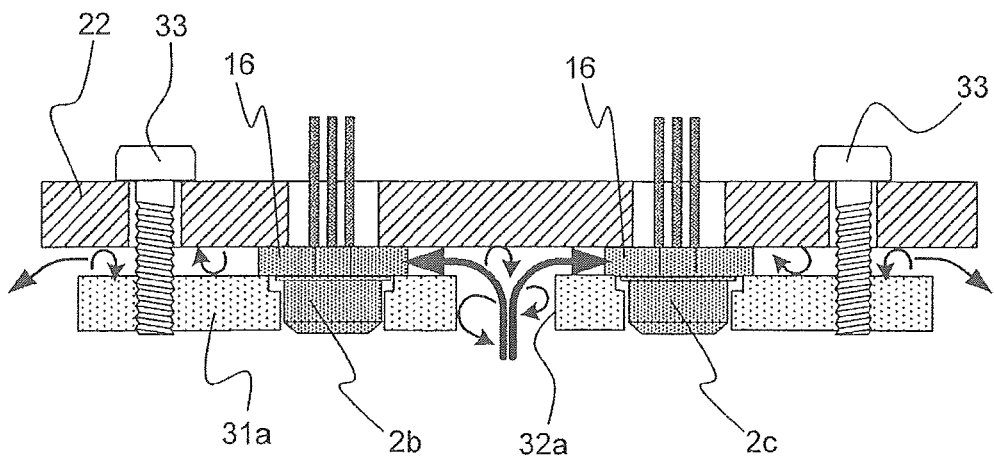
FIG. 10B is a schematic sectional view illustrating the configuration shown in FIG. 10A.
Figure 10C:
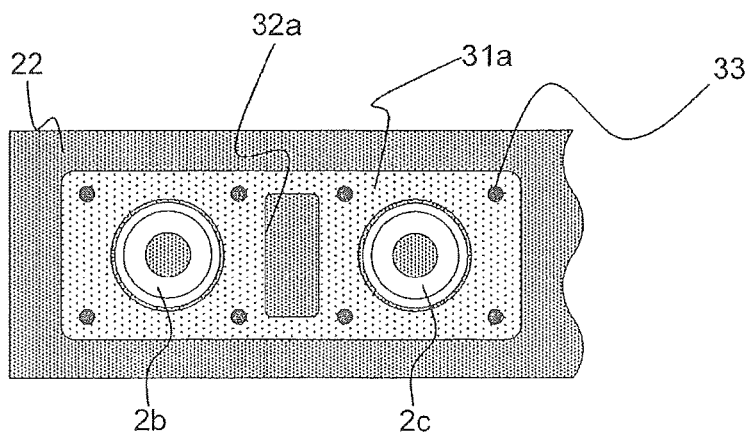
FIG. 10C is a schematic plan view illustrating the configuration shown in FIG. 10A.

To prevent this problem, preferably, as shown in FIGS. 10A to 10C, through-hole 32a is formed in support plate 31a. The method for supporting light emitting elements 2b and 2c on support plate 31a and the method for fixing support plate 31a to base plate 22 are similar to those shown in FIGS. 9B and 9C. In this case, air perpendicularly blown from cooling fan 24 to light emitting elements 2b and 2c passes through through-hole 32a of support plate 31 to perpendicularly impinges on stem 16 of light emitting elements 2b and 2c and nearby base plate 22. Accordingly, a swirling vortex of a turbulent flow is generated in the space between support plate 31a and base plate 22. As a result, near light emitting elements 2b and 2c, the heat transfer coefficient from light emitting elements 2b and 2c or base plate 22 to cooling air is greatly increased to improve heat dissipation performance.

In the example shown in FIGS. 10A and 10C, roughly rectangular through-hole 32a is fixated in support plate 31a. The through-hole formed in support plate 31 can have other shapes as shown in FIGS. 11A to 11D.

Figure 11A:
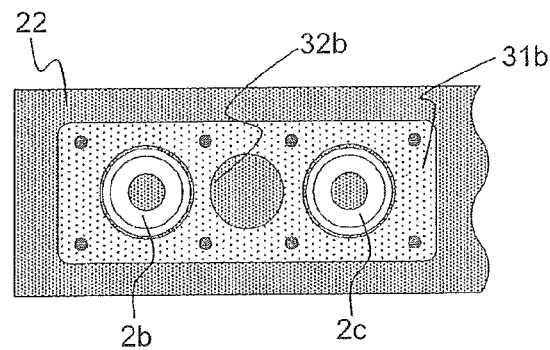
FIG. 11A is a schematic plan view illustrating another configuration for fixing the light emitting element to the base plate.
Figure 11B:
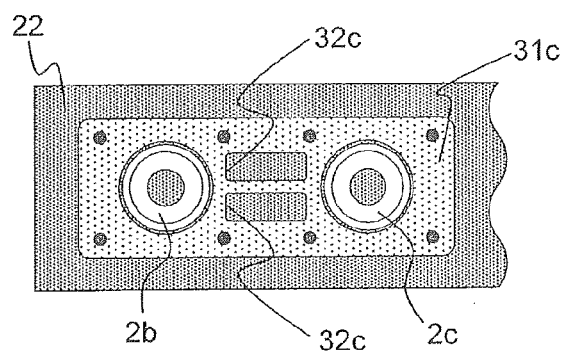
FIG. 11B is a schematic plan view illustrating other configuration for fixing the light emitting element to the base plate.
Figure 11C:
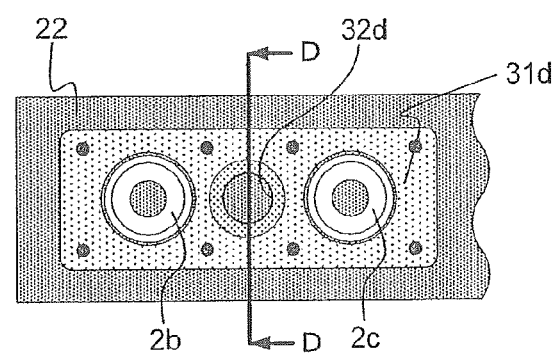
FIG. 11C is a schematic plan view illustrating yet another configuration for fixing the light emitting element to the base plate.
Figure 11D:
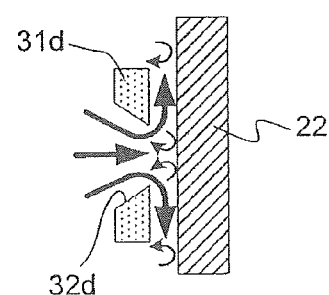
FIG. 11D is a schematic sectional view cut along the line D-D shown in FIG. 11C.

In an example shown in FIG. 11A, circular through-hole 32b is formed in support plate 31b. In an example shown in FIG. 11B, two roughly rectangular through-holes 32c are formed in support plate 31c. In examples shown in FIGS. 11C and 11D, nozzle-shaped through-holes 32d are formed in support plate 31d. As shown in FIG. 11D, nozzle-shaped through-hole 32d has a roughly conical shape which is tapered toward a base plate 22. When air passes through nozzle-shaped through-hole 32d, the flow velocity of the air increases due to a Venturi effect to locally generate a strong jet flow in base plate 22 near light emitting elements 2b and 2c. Thus, the cooling effect of light emitting elements 2b and 2c can be further improved.

The shapes of through-holes 32a to 32d shown in FIGS. 11A to 11E are examples, and the through-holes can have other shapes. In the embodiment, reference has been made to support plates 31a to 31d that support light emitting elements 2b and 2c. Similarly, a through-hole can be formed in a support plate to support light emitting element 2a.

The preferred embodiments of the present invention have been described in detail. However, the present invention is not limited to the embodiments. It should be understood that various changes and modifications can be made without departing from the spirit and the scope of the present invention.

REFERENCE SIGNS LIST 2a to 2c light emitting element
3a to 3c collimator lens
4a, 4b dichroic mirror
20 heat sink
22, 22a to 22e base plate
23 heat dissipation fin
24 air flow device
25a to 25d duct
26a to 26e light source device
28 micro-projection
30 micro-dent (dimple)
31a to 31d support plate
32a to 32d through-hole

The invention claimed is:
1. A light source device comprising:
a first light emitting element;
a base plate thermally connected to the first light emitting element and having a flat surface formed around the first light emitting element to face an emitting direction of light output from the first light emitting element;
an air flow device for sending out air;
an optical component disposed between the first light emitting element and the air flow device, the optical component configured to act on the light emitted from the first light emitting element and to bend a direction of a part of the air sent out from the air flow device;
a second light emitting element disposed on a downstream side of a bent direction of the air which is bent by the optical component: and
a second base plate thermally connected to the second light emitting element and having a flat surface formed around the second light emitting element to face an emitting direction of light output from the second light emitting element,
wherein the air flow device generates a flow of air toward the flat surface of the base plate in a direction perpendicular to the flat surface; and the optical component reflects the light emitted from the first light emitting element, transmits the light emitted from the second light emitting element, and synthesizes the light from the first light emitting element and the light from the second light emitting element.

2. The light source device according to claim 1, wherein a part of the base plate constitutes an exhaust duct.

3. The light source device according to claim 1, further comprising an exhaust duct thermally connected to the base plate and formed separately from the base plate.

4. The light source device according to claim 1, further comprising a support plate disposed on the flat surface side of the base plate, the support plate configured to support the light emitting element and to be fixed on the base plate, wherein the support plate has a through-hole through which the air sent out from the air flow device passes.

5. A projection-type display device comprising:

the light source device according to claim 1.

6. The light source device according to claim 1, wherein the optical component comprises a dichroic mirror.

7. The light source device according to claim 2, wherein a turbulent flow accelerator to accelerate generation of a turbulent flow is disposed on an inner wall of the exhaust duct.

8. The light source device according to claim 2, wherein a heat dissipation fin is disposed on an inner wall of the exhaust duct.

9. The light source device according to claim 2, further comprising a heat sink disposed outside an exhaust port of the exhaust duct and thermally connected to the base plate.

10. A light source device comprising:

a first light emitting element;

a first flat surface thermally connected to the first light emitting element and formed around the first light emitting element to face an emitting direction of light output from the first light emitting element;

an air flow device for sending out air, the air flow device generating a flow of air toward the first flat surface in a direction perpendicular to the first flat surface;

an optical component disposed between the first light emitting element and the air flow device, the optical component configured to act on the light emitted from the first light emitting element and to bend a direction of a part of the air sent out from the air flow device;

a second light emitting element disposed on a downstream side of a bent direction of the air which is bent by the optical component;

a second flat surface thermally connected to the second light emitting element and formed around the second light emitting element to face an emitting direction of light output from the second light emitting element; and a base plate including the first flat surface and the second flat surface, wherein the optical component reflects the light emitted from the first light emitting element, transmits the light emitted from the second light emitting element, and synthesizes the light from the first light emitting element and the light from the second light emitting element.

11. The light source device according to claim 10, wherein a part of the base plate constitutes an exhaust duct.

12. The light source device according to claim 10, further comprising an exhaust duct thermally connected to the base plate and formed separately from the base plate.

13. The light source device according to claim 10, further comprising a support plate which is disposed on the first flat surface to support the first light emitting element or which is disposed on the second flat surface to support the second light emitting element, wherein the support plate is fixed on the base plate, and wherein the support plate has a through-hole through which the air sent out from the air flow device passes.

14. A projection-type display device comprising:

the light source device according to claim 10.

15. The light source device according to claim 10, wherein the optical component comprises a dichroic mirror.

16. The light source device according to claim 11, wherein a turbulent flow accelerator to accelerate generation of a turbulent flow is disposed on an inner wall of the exhaust duct.

17. The light source device according to claim 11, wherein a heat dissipation fin is disposed on an inner wall of the exhaust duct.

18. The light source device according to claim 11, further comprising a heat sink disposed outside an exhaust port of the exhaust duct and thermally connected to the base plate.

* * * * *